United States Patent
Yoon et al.

(10) Patent No.: US 7,652,651 B2
(45) Date of Patent: Jan. 26, 2010

(54) ANALOG SAMPLING APPARATUS FOR LIQUID CRYSTAL DISPLAY

(75) Inventors: Jin Mo Yoon, Goyang-si (KR); Jhun Suk Yoo, Seocho-gu (KR)

(73) Assignee: LG Display Co., Ltd., Seoul (KR)

( * ) Notice: Subject to any disclaimer, the term of this patent is extended or adjusted under 35 U.S.C. 154(b) by 589 days.

(21) Appl. No.: 11/477,346

(22) Filed: Jun. 30, 2006

(65) Prior Publication Data
US 2007/0001989 A1    Jan. 4, 2007

(30) Foreign Application Priority Data
Jun. 30, 2005    (KR) ............... 10-2005-0057941

(51) Int. Cl.
*G09G 3/36* (2006.01)
(52) U.S. Cl. .................. 345/98; 345/100
(58) Field of Classification Search ............ 345/98–100
See application file for complete search history.

(56) References Cited

U.S. PATENT DOCUMENTS 5,151,689 A * 9/1992 Kabuto et al. ............... 345/103
5,170,158 A * 12/1992 Shinya ......................... 345/98

FOREIGN PATENT DOCUMENTS

JP    01262592 A  * 10/1989

\* cited by examiner

*Primary Examiner*—Amare Mengistu
*Assistant Examiner*—Koosha Sharifi
(74) *Attorney, Agent, or Firm*—McKenna Long & Aldridge LLP

(57) ABSTRACT

An analog sampling apparatus for a liquid crystal display device includes: a data driver to generate an analog data voltage; a data output bus line to receive the analog data voltage; a first sampling and holding circuit connected to the data output bus line to compensate an offset voltage in the analog data voltage and to supply the analog data voltage to a data line of a liquid crystal display panel; and a second sampling and holding circuit connected to the data output bus line arranged to sample the analog data voltage while the analog data voltage is supplied to the data line by the first sampling and holding circuit. The first sampling and holding circuit is arranged to supply the analog data voltage while the second sampling and holding circuit samples the analog data voltage, and to sample the analog data voltage while the second sampling and holding circuit supplies the analog data voltage.

6 Claims, 9 Drawing Sheets

Input Sampling

Output Buffering

ANALOG SAMPLING APPARATUS FOR LIQUID CRYSTAL DISPLAY

This application claims the benefit of Korean Patent Application No. P2005-0057941, filed on Jun. 30, 2005, which is hereby incorporated by reference for all purposes as if fully set forth herein.

BACKGROUND OF THE INVENTION

1. Field of the Invention

The present invention relates to a liquid crystal display device, and more particularly to an analog sampling apparatus of a liquid crystal display device for sufficiently securing a sampling time and a data driving time.

2. Discussion of the Related Art

A liquid crystal display device controls the light transmittance of liquid crystal cells in accordance with a video signal, to display a picture.

In a typical active matrix type liquid crystal display device, active switching devices are used to control the electric fields in each liquid crystal cell to control the light transmittance of the cell. By controlling the active switching devices, moving images can be displayed. A thin film transistor (hereinafter, referred to as 'TFT') is the device primarily used for switching devices in the active matrix type liquid crystal display device.

A liquid crystal display device of the related art, as shown in FIG. 1, includes a liquid crystal display panel 2 having a plurality of data lines 5 crossing a plurality of gate lines 6 and TFTs for driving liquid crystal cells formed at the crossings of the gate and data lines; a data driver 3 for supplying data to the data lines 5; a gate driver 4 for supplying a scan pulse to the gate lines 6; and a timing controller 1 for controlling the data driver 3 and the gate driver 4.

The liquid crystal display panel 2 includes liquid crystal injected between two glass substrates. The data lines 5, gate lines 6 and TFTs are formed on a lower of the two glass substrates. The TFTs supply the data from the data lines 5 to the liquid crystal cell in response to the scan pulse from the gate lines 6. To this end, a gate electrode of the TFT is connected to the gate line 6, a source electrode is connected to the data line 5, and a drain electrode of the TFT is connected to a pixel electrode of the liquid crystal cell Clc. Further, a storage capacitor Cst for maintaining the voltage of the liquid crystal cell is formed on the lower glass substrate of the liquid crystal display panel.

The timing controller 1 receives digital video data RGB, a horizontal synchronization signal H, a vertical synchronization signal V, and a clock signal CLK and generates a gate control signal GDC for controlling the gate driver 4 and a data control signal DDC for controlling the data driver 3. Further, the timing controller 1 supplies the digital video data RGB to the data driver 3.

The gate driver 4 includes a shift register for sequentially generating a scan pulse in response to the gate control signal GDC from the timing controller 1; a level shifter for shifting a swing width of the scan pulse to a level that is suitable for driving the liquid crystal cell Clc; an output buffer, etc. The gate driver 4 supplies the scan pulse to the gate line 6 to turn on the TFTs connected to the gate line 6, thereby selecting the liquid crystal cells Clc of one horizontal line to which a pixel voltage, i.e., analog gamma compensation voltage, of the data is to be supplied. The data generated by the data driver 3 is supplied to the liquid crystal cell Clc of the horizontal line that is selected by the scan pulse.

The data driver 3 supplies the data to the data lines 5 in response to the data drive control signal DDC supplied from the timing controller 1. The data driver 3 samples the digital data RGB from the timing controller 1, latches the data, and then converts the data into an analog gamma voltage. The data driver 3 may be realized as a plurality of data integrated circuits (hereinafter, referred to as 'ICs') each having a configuration as shown in FIG. 2.

Each of the data ICs 3A, as shown in FIG. 2, includes a data register 21 that receives the digital data RGB from the timing controller 1; a shift register 22 for generating a sampling clock; a first latch 23, a second latch 24, and a digital/analog converter (hereinafter, referred to as 'DAC') 25 that are connected between the shift register 22 and an output circuit 26 by k (where k is an integer smaller than m, the number of data lines of the liquid crystal display panel) number of data lines DL1 to DLk; and a gamma voltage supplier 27 connected between the gamma reference voltage generator 4 and a DAC 25.

The data register 21 supplies the digital data RGB from the timing controller 1 to the first latch 23. The shift register 22 shifts a source start pulse from the timing controller 1 in accordance with a source sampling clock signal SSC to generate a sampling signal. Further, the shift register 22 shifts a source start pulse SSP to transmit a carry signal CAR to the shift register 22 of the next stage. The first latch 23 sequentially samples the digital data RGB from the data register 21 in response to the sampling signal that is sequentially supplied by the shift register 22. The second latch 24 latches the data supplied from the first latch 23, and then simultaneously outputs the latched data in response to a source output enable signal SOE from the timing controller 1. The DAC 25 converts the data from the second latch 24 into a gamma voltage DGH, DGL from the gamma voltage supplier 27. The gamma voltage DGH, DGL is an analog voltage that corresponds to each of the gray levels of the digital input data. The output circuit 26 includes a buffer connected to each of the data lines. The gamma voltage supplier 27 subdivides the gamma reference voltage inputted from the gamma reference voltage generator 4 to supply the gamma voltage corresponding to each gray level to the DAC 25.

The data drive circuit has a complicated circuit configuration, and the circuitry of the data drive circuit occupies a large area, making embedding the data drive circuitry on the substrate of the liquid crystal display panel difficult.

An analog sampling type liquid crystal display device has been proposed as a solution. As shown in FIG. 3, a analog sampling type liquid crystal display device of the related art includes common bus lines 201 to 240 connected to an output terminal of the data register 21 in a one-to-one relationship, with a channel selecting part 34 and a sampling & holding part 33 disposed between the common bus lines 201 to 240 and the data lines DL1 to DL42. A plurality of data output bus lines are connected to each of the common bus lines 201 to 240. For example, the first and $41^{st}$ data output bus lines 301 and 341 are connected to the first common bus line 201. The channel selecting part 34 includes a plurality of switch devices 34A that are connected to the data output bus lines 301 in the one-to-one relationship. The switch devices 34A for the channel selecting part 34 may be implemented using CMOS technology and are sequentially turned on in response to a control signal from the shift register 32, thereby acting to supply the data from the data output bus lines 301 to the sampling & holding part 33. The sampling & holding part 33 sequentially samples and holds the data from the channel selecting part 34, and then supplies the held data to the data lines DL1 to DL42 simultaneously.

However, in the analog sampling method of the related art, the time available for sampling the data in the sampling & holding part 34 and supplying the data voltage to the data lines is too short to supply the desired voltages to the liquid crystal cells.

SUMMARY OF THE INVENTION

Accordingly, the present invention is directed to an analog sampling apparatus for liquid crystal display that substantially obviates one or more of the problems due to limitations and disadvantages of the related art.

An advantage of the present invention is to provide an analog sampling apparatus of a liquid crystal display device that for sufficiently securing a sampling time and a data driving time.

To achieve these and other advantages and in accordance with the purpose of the present invention, as embodied and broadly described, an analog sampling apparatus of a liquid crystal display device includes a data driver to generate an analog data voltage; a data output bus line to receive the analog data voltage; a first sampling and holding circuit connected to the data output bus line to compensate an offset voltage in the analog data voltage and to supply the analog data voltage to a data line of a liquid crystal display panel; and a second sampling and holding circuit connected to the data output bus line arranged to sample the analog data voltage while the analog data voltage is supplied to the data line by the first sampling and holding circuit, wherein the first sampling and holding circuit is arranged to supply the analog data voltage while the second sampling and holding circuit samples the analog data voltage, and to sample the analog data voltage while the second sampling and holding circuit supplies the analog data voltage.

In another aspect of the invention, an analog sampling apparatus of a liquid crystal display device includes: a data driver to generate an analog data voltage; a data output bus line to receive the analog data voltage; an output node to output the analog data voltage; a first sampling and holding circuit connected to the data output bus line to compensate the analog data voltage for an offset voltage to control a voltage of the output node with the compensated analog data voltage; and a second sampling and holding circuit connected to the data output bus line to sample the analog data voltage while the voltage of the output node is controlled by the first sampling and holding circuit, wherein the first and second sampling and holding circuits are arranged to alternately control operation of the voltage of the output node and to sample the analog data voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the embodiments of the present invention, examples of which are illustrated in the accompanying drawings.

With reference to FIGS. 4 to 9, embodiments of the present invention will be explained as follows.

Figure 4:
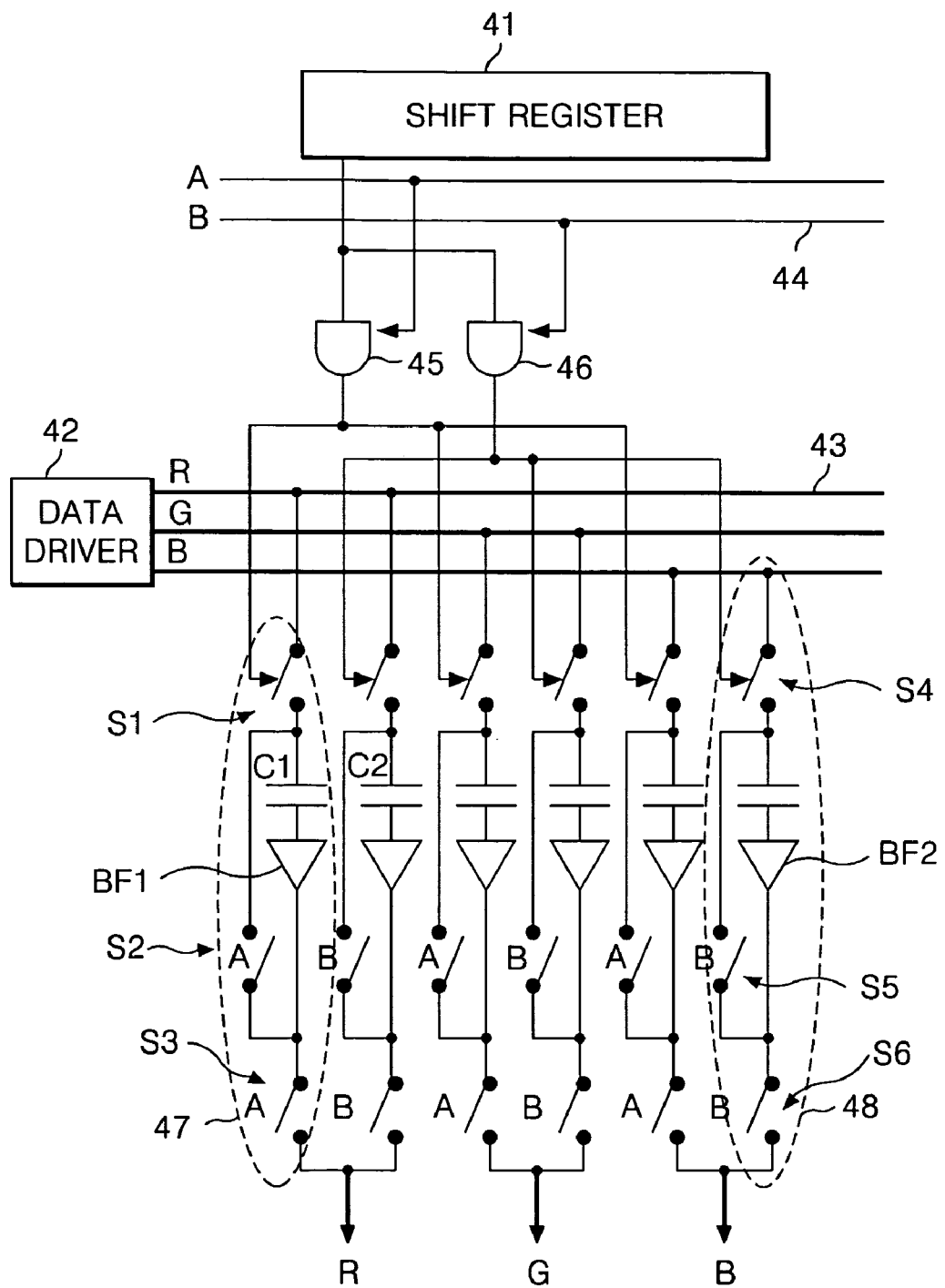
FIG. 4 is a circuit diagram illustrating an analog sampling apparatus of a liquid crystal display device according to an embodiment of the present invention.

Referring to FIG. 4, an analog sampling device of a liquid crystal display device according to an embodiment of the present invention includes a data driver 42 for converting digital data into an analog data voltage; first and second sampling & holding circuits 47 and 48 connected between the data driver 42 and the data lines of the liquid crystal display panel; a shift register 41 for controlling the sampling & holding circuits 47 and 48; and AND gates 45 and 46.

The data driver 42 includes a shift register, a latch and a DAC, and converts the digital data from the timing controller into an analog data voltage and outputs the analog data voltage through data output buses 43.

The first sampling & holding circuit 47 and the second sampling & holding circuit 48 alternately sample the analog data voltage and supply the analog data voltage to the data lines of the liquid crystal display panel. That is to say, while the first sampling & holding circuit 47 performs an analog sampling, the second sampling & holding circuit 48 compensates the analog data voltage for a buffer offset voltage to supply to the data lines of the liquid crystal display panel. While the second sampling & holding circuit 48 performs an analog sampling, the first sampling & holding circuit 47 compensates the analog data voltage for a buffer offset voltage to supply to the data lines of the liquid crystal display panel. A detailed description of the circuit configuration of the sampling & holding circuits 47 and 48 and an explanation for the operation thereof will be described hereinafter with reference to FIGS. 4 and 5.

Figure 5:
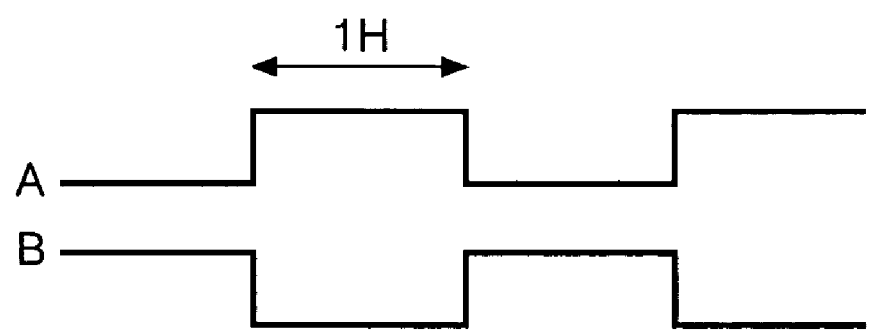
FIG. 5 is a waveform diagram illustrating A and B control signals.

The sampling & holding circuits 47 and 48 are controlled by an output signal generated by the AND gates from the control signals A and B. The control signals A and B, as shown in FIG. 5, are generated by the timing controller to have a pulse width of one horizontal period (1H) and a period of two horizontal periods. The A and B control signals have opposite phases and are supplied to the AND gates 45 and 46 through the control signal bus line 44. The first AND gate 45 generates an AND output of the A control signal and the output of the shift register. The second AND gate 46 generates an AND output of the B control signal and the output of the shift register.

The first sampling & holding circuit 47 includes a first switch device S1 connected to an output node of the first AND gate 45; a second switch device S2 connected between the first switch device S1 and the data lines of the liquid crystal display panel; a first capacitor C1; a first buffer BF1; and a third switch device S3. The first switch device S1 connects the data output bus 43 and the first capacitor C1 in response to the output of the first AND gate 45 for a first horizontal period, but interrupts the current path between the data output bus 43 and the first capacitor C1 for the second horizontal period. The first capacitor C1 stores a voltage difference between the analog data voltage and the offset voltage generated in the first buffer BF1, thereby acting to compensate the analog data voltage for the offset voltage of the first buffer BF1. The second and third switch devices S2 and S3 connect the first capacitor C1 to the data line of the liquid crystal display panel to supply the compensated analog data voltage to the data line in response to the A control signal being at logic high for a first horizontal period. Further, during the second horizontal period, the second switch S2 is turned off in response to the A control signal being at logic low to interrupt the current path between the first capacitor C1 and the third switch device S3. The third switch S3 is turned off in response to the A control signal being at logic low, interrupting the current path between the first buffer BF1 and the data line of the liquid crystal display panel. In summary, the first sampling & holding circuit 47 supplies an analog data voltage compensated for the offset of the buffer B1 for the first horizontal period, and then compensates for the offset of the buffer BF1 in the analog data voltage by use of the first capacitor C1 for the second horizontal period.

The second sampling & holding circuit 48 includes a fourth switch device S4 connected to an output node of the second AND gate 46; a fifth switch device S5 connected between the fourth switch device S4 and the data lines of the liquid crystal display panel; a second capacitor C2; a second buffer BF2; and a sixth switch device S6. The fourth switch device S4 connects the data output bus 43 and the second capacitor C2 in response to the output of the second AND gate 46 for a second horizontal period, but interrupts the current path between the data output bus 43 and the second capacitor C2 for the first horizontal period. The second capacitor C2 stores the voltage difference between the analog data voltage and the offset voltage generated in the second buffer BF2, thereby acting to compensate the analog data voltage for the offset voltage of the second buffer BF2. The fifth and sixth switch devices S5 and S6 connect the second capacitor C2 to the data line of the liquid crystal display panel to supply the compensated analog data voltage in response to the A control signal being at logic high for the second horizontal period. Further, for the first horizontal period, the fifth switch S5 is turned off in response to the A control signal being at logic low to interrupt the current path between the second capacitor C2 and the sixth switch device S6, and the sixth switch S6 is turned off in response to the A control signal being at logic low to interrupt a current path between the second buffer BF2 and the data line of the liquid crystal display panel. In summary, the second sampling & holding circuit 48 supplies an analog data voltage compensated for the offset of the BF2 buffer for the second horizontal period, and compensates for the offset of the buffer BF2 in the analog data voltage by use of the second capacitor C2 for the first horizontal period therebefore.

Figure 6:
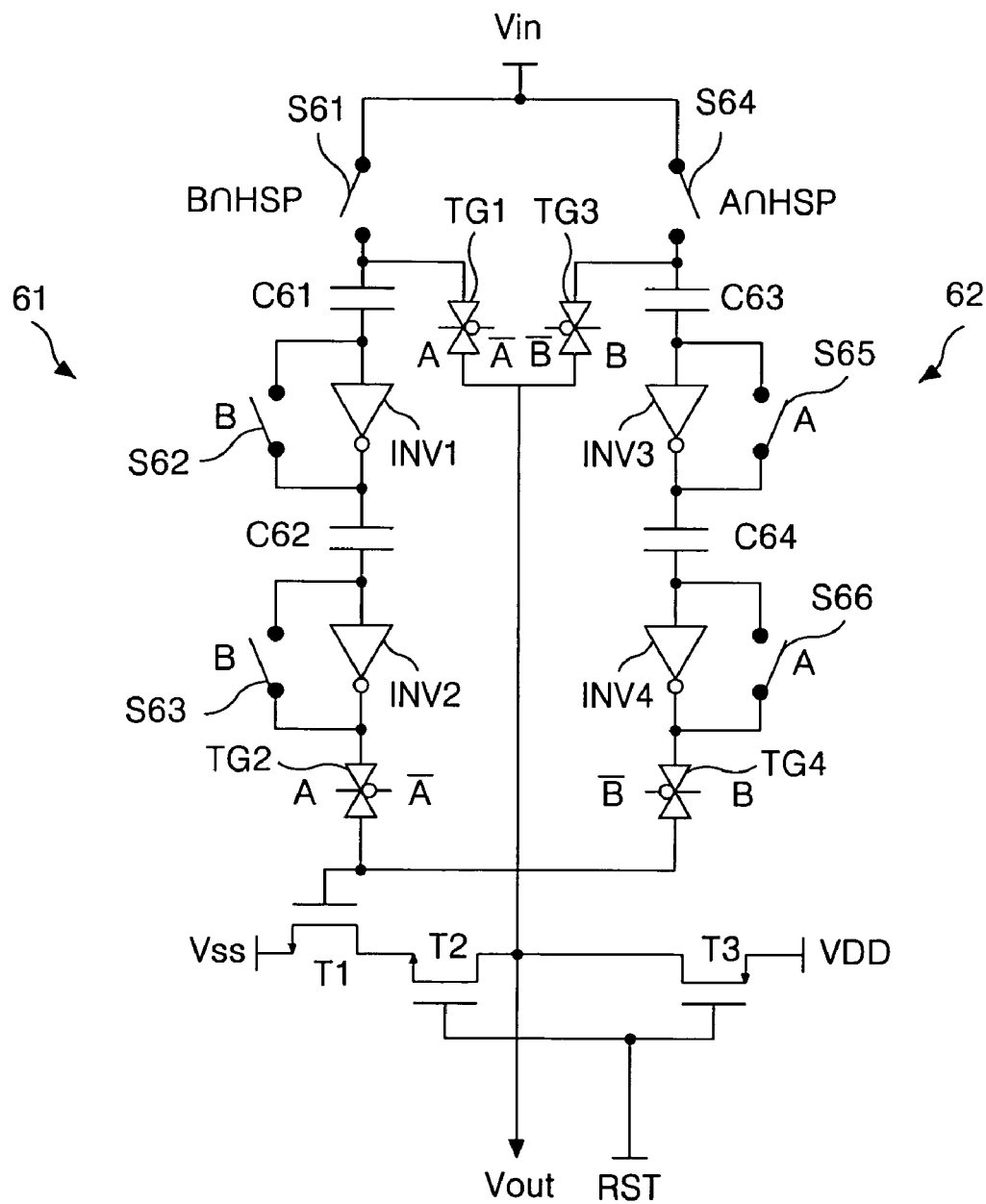
FIG. 6 is a circuit diagram illustrating an analog sampling apparatus of a liquid crystal display device according to another embodiment of the present invention.
Figure 7:
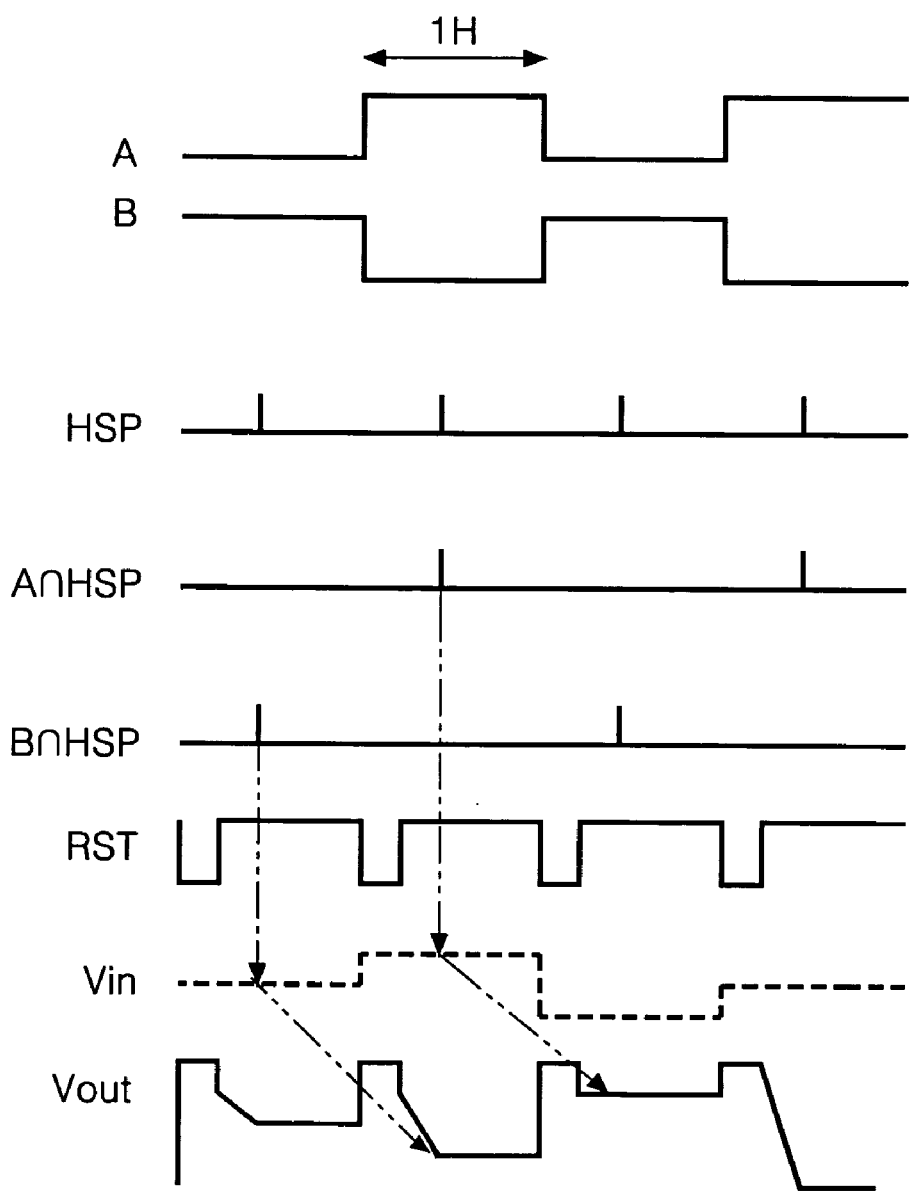
FIG. 7 is an input and output waveform diagram of the analog sampling apparatus for the liquid crystal display device shown in FIG. 6.

FIG. 6 illustrates an analog sampling apparatus of a liquid crystal display device according to another embodiment of the present invention, and FIG. 7 shows the input/output waveforms of the analog sampling apparatus shown in FIG. 6. In FIG. 6, the data driver, the data output bus, etc shown in FIG. 4 are omitted.

Referring to FIGS. 6 and 7, the analog sampling apparatus of the liquid crystal display device according to an embodiment of the present invention includes first and second sampling & holding circuits 61 and 62 connected between the data driver and the data lines of the liquid crystal display panel; first and third transmission gates TG1 and TG3 for supplying an output voltage Vout to an output node in response to the A and B control signals; a first transistor T1 for controlling the output voltage Vout in accordance with the output of the first and second sampling & holding circuits 61 and 62; and second and third transistors T2 and T3 for generating the output voltage Vout in response to a reset signal RST.

The first sampling & holding circuit 61 and the second sampling & holding circuit 62 alternately sample the analog data voltage and supply the analog data voltage to the data lines of the liquid crystal display panel. That is to say, the second sampling & holding circuit 62 compensates for the buffer offset voltage in the analog data voltage to supply to the data lines of the liquid crystal display panel while the first sampling & holding circuit 61 samples the analog data, and then the first sampling & holding circuit 61 compensates for the buffer offset voltage in the analog data voltage to supply to the data lines of the liquid crystal display panel while the second sampling & holding circuit 62 samples the analog data.

The first sampling & holding circuit 61 includes a first switch device S61 connected to an output node of the first AND gate 45; second and third switch devices S62 and S63 connected between the first switch device 61 and the data lines of the liquid crystal display panel; first and second capacitors C61 and C62; first and second inverters INV1 and INV2; and a second transmission gate TG2. The first switch device S61 is turned on in response to a logic high value of a B∩HSP signal generated at a sampling point of time within the period in which the B control signal is at logic high to supply the analog data voltage Vin from the data output bus 43 to the first capacitor C61. The first switch device S61 is turned off to interrupt the current path between an input terminal and the first capacitor C61 when the B∩HSP signal is at logic low. The first capacitor C61 stores the voltage difference between the input voltage Vin and the offset voltage of the first inverter INV1, thereby acting to compensate the input voltage Vin for the offset voltage of the first inverter INV1. The second switch device S62 is turned on to complete the current path between the first capacitor C61 and the second capacitor S62 when the B control signal is logic high, but interrupts the current path between the first capacitor C61 and the second capacitor C62 when the B control signal is at logic low. The second capacitor C62 stores the voltage difference between of the output voltage of the first inverter INV1 and the offset voltage of the second inverter INV2, thereby acting to compensate the output voltage of the first inverter INV1 for the offset voltage of the second inverter INV2. The second transmission gate TG2 is turned on to supply the input voltage where the offset voltage is compensated to a gate terminal of the first transistor T1 when the A control signal is at logic high, thereby compensating for the offset voltage in the output voltage Vout.

The second sampling & holding circuit 62 includes a fourth switch device S64 connected to an output node of the second AND gate 46; fifth and sixth switch devices S65, S66 connected between the fourth switch device 64 and the data lines of the liquid crystal display panel; third and fourth capacitors C63, C64; third and fourth inverters INV3 and INV4; and a fourth transmission gate TG4. The fourth switch device S64 is turned on in response to a A∩HSP signal generated at a logic high at a sampling point of time during a period when the A control signal is at logic high to supply the analog data voltage Vin from the data output bus 43 to the third capacitor C63. The fourth switch device S64 is turned off to interrupt a current path between an input terminal and the third capacitor C63 when the A∩ HSP signal is at logic low. The third capacitor C63 stores the voltage difference between the input voltage Vin and the offset voltage of the third inverter INV3, thereby acting to compensate the input voltage Vin for the offset voltage of the third inverter INV3. The fifth switch device S65 is turned on to complete the current path between the third capacitor C63 and the fourth capacitor S64 when the A control signal is at logic high, but interrupts the current path between the third capacitor C63 and the fourth capacitor C64 when the A control signal is at logic low. The fourth capacitor C64 stores the voltage difference between the output voltage of the third inverter INV3 and the offset voltage of the fourth inverter INV4, thereby acting to compensate the output voltage of the third inverter INV3 for the offset voltage of the fourth inverter INV4. The fourth transmission gate TG4 is turned on to supply the offset compensated input voltage to a gate terminal of the first transistor T1 when the B control signal is at logic high, thereby compensating for the offset voltage in the output voltage Vout.

The first transistor T1 may be realized as an n-type MOSFET. A gate terminal of T1 is connected to the output terminal of the second and fourth transmission gates TG2 and TG4. A source terminal of the first transistor T1 is connected to a low potential voltage source VSS and a drain terminal of the first transistor T1 is connected to a source terminal of the second transistor T2. The first transistor T1 controls the current between the source and the drain in proportion to the offset compensated analog data voltage from the first and second sampling & holding circuits 61 and 62, thereby compensating for the offset in the output voltage.

The second transistor T2 may be realized as an n-type MOSFET, and a reset voltage is supplied to the gate terminal of T2. A source terminal of the second transistor T2 is connected to a drain terminal of the first transistor T1 and a drain terminal of the second transistor T2 is connected to the output node. The second transistor T2 is turned on to supply the low potential voltage VSS controlled by the first transistor T1 to the data line of the liquid crystal display panel through the output node when the reset voltage RST is at logic high, but is turned off to interrupt the current path between the output node and the first transistor T1 when the reset voltage RST is at logic low.

The third transistor T3 may be realized as a p-type MOSFET, and a reset voltage is supplied to the gate terminal of the transistor T3. A source terminal of the third transistor T3 is connected to a high potential voltage source VDD and a drain terminal of the third transistor T3 is connected to the output node. The third transistor T3 is turned on to supply the high potential voltage VSS as a pre-charge voltage to the data line of the liquid crystal display panel through the output node when the reset voltage RST is at logic low, and is turned off to interrupt the current path between the output node and the high potential voltage source VDD when the reset voltage RST is at logic high.

The third transmission gate TG3 supplies the input voltage Vin supplied through the fourth switch device S64 to the output node when the generated A control signal is at a logic high level or voltage. The first transmission gate TG1 supplies the input voltage Vin supplied through the first switch device S61 to the output node when the generated B control signal is at a logic high level.

Figure 1:
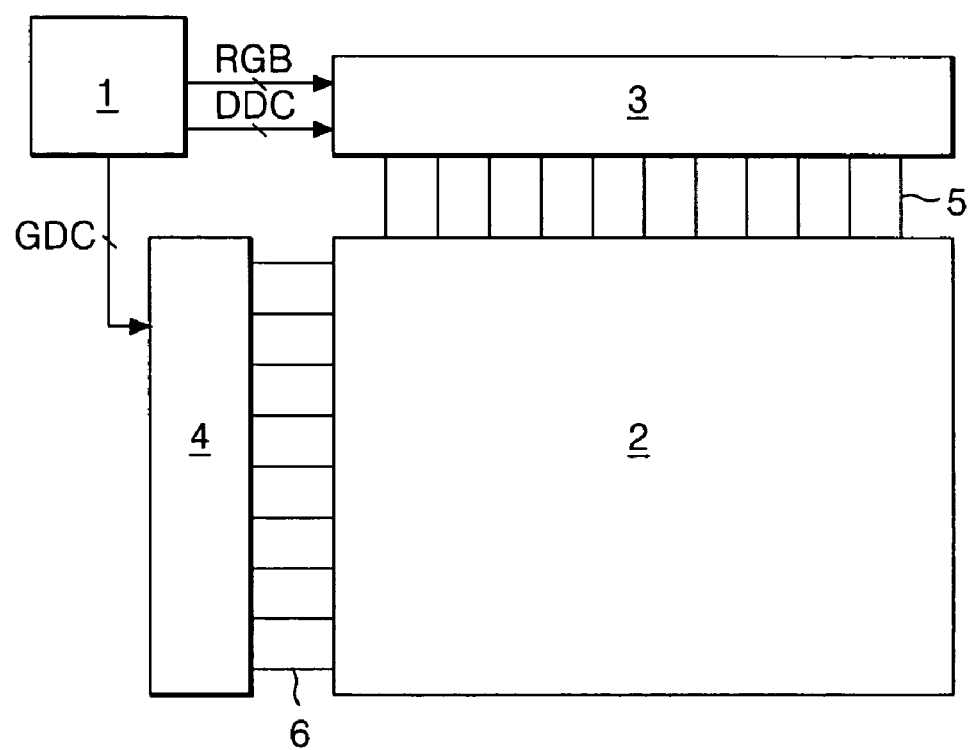
FIG. 1 is a block diagram illustrating a liquid crystal display device.
Figure 2:
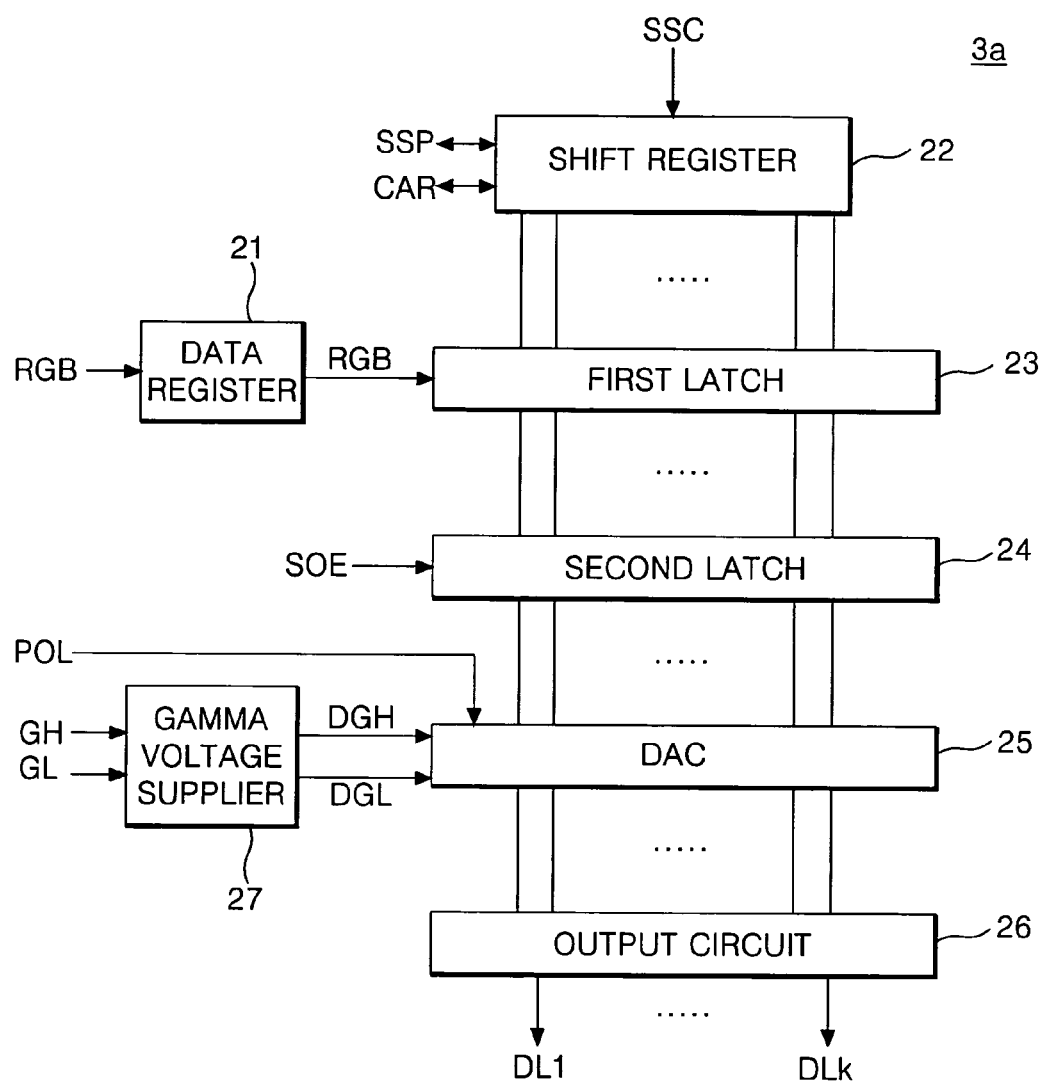
FIG. 2 is a detailed block diagram illustrating a data driver shown in FIG. 1.
Figure 3:
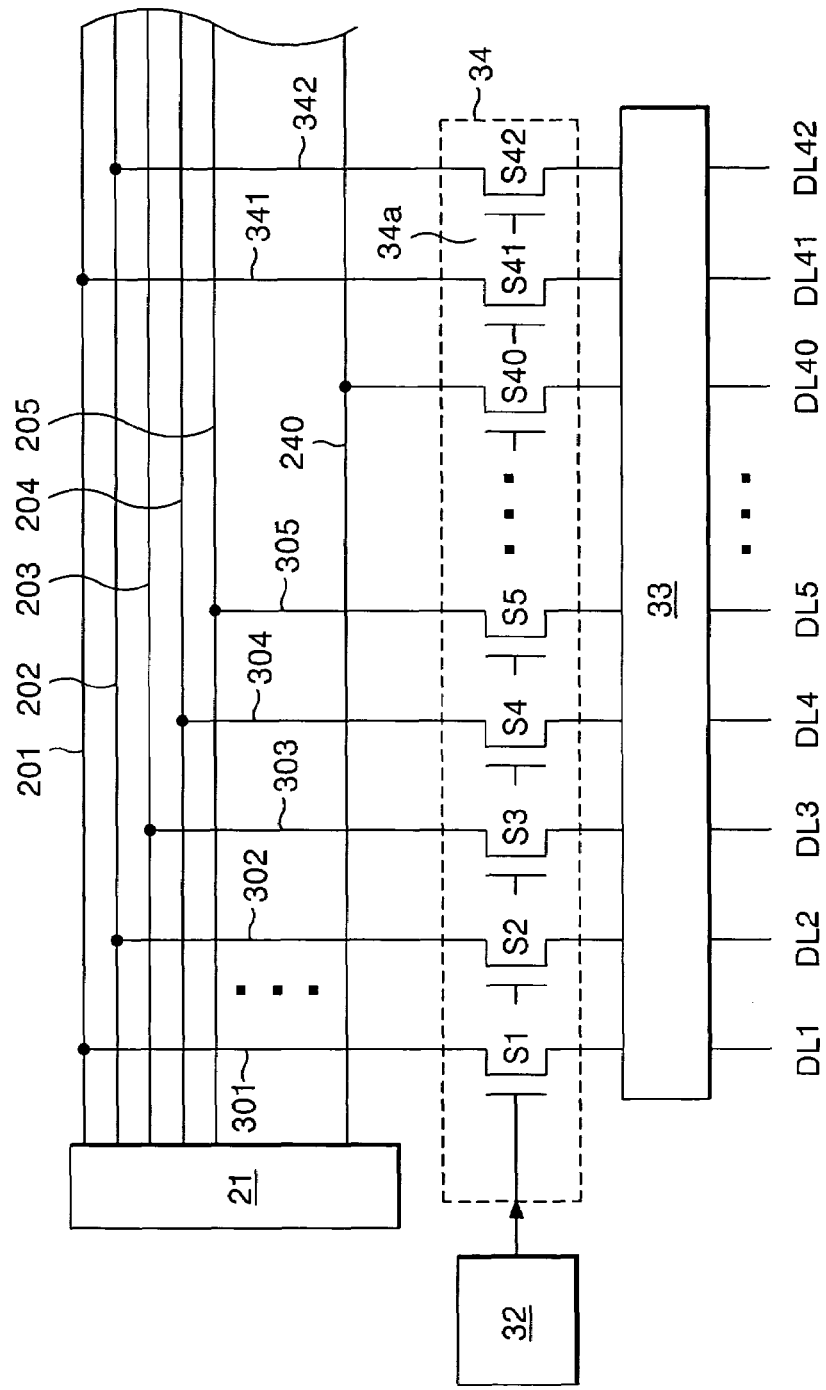
FIG. 3 is a block diagram illustrating a data driving device of the analog sampling type.

As shown in FIG. 7, the A and B control signals are generated to have a pulse width of one horizontal period 1H and a period of two horizontal periods in the same manner as the foregoing first embodiment, and have opposite phases. The HSP signal is generated to have a high logic voltage at the point of time for sampling of the analog data voltage, and appears at an interval of one horizontal period. The A∩HSP signal is generated have a high logic level at the point of time when the analog data voltage is sampled by the second sampling & holding circuit 62, appears at an interval of two horizontal periods, and is synchronized with an even-numbered HSP signal. The B∩HSP signal is generated to have a high logic voltage at the point of time when the analog data voltage is sampled by the first sampling & holding circuit 61, appears with an interval of two horizontal periods, and is synchronized with an odd-numbered HSP signal. The RST signal is a reset signal and is generated to be at a logic low voltage for a pre-charge period and to be at a logic high voltage for a data charging period of the liquid crystal cell. The timing control signals are generated in the timing controller 1, as shown in FIG. 1.

The operation of the analog sampling apparatus of the liquid crystal display device according to the second embodiment of the present invention, with the A control signal at a logic high level and the B control signal at a logic low level will be explained in conjunction with FIGS. 7 to 9.

Figure 8:
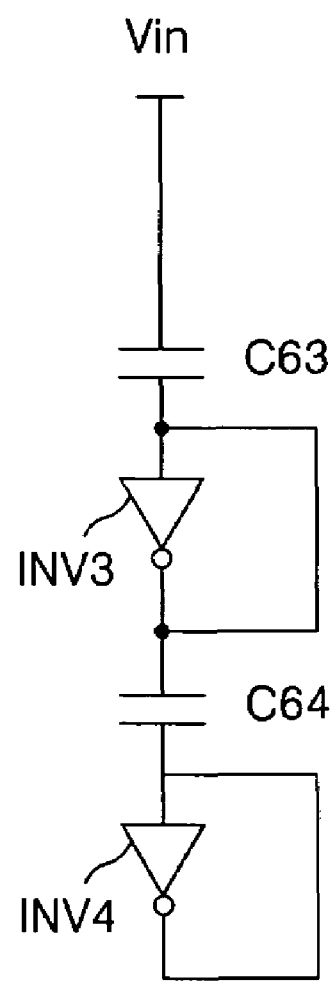
FIG. 8 is a circuit diagram illustrating an input sampling of a second sampling & holding circuit when an A control signal is at a logic high voltage and a B control signal is at a logic low voltage.
Figure 9:
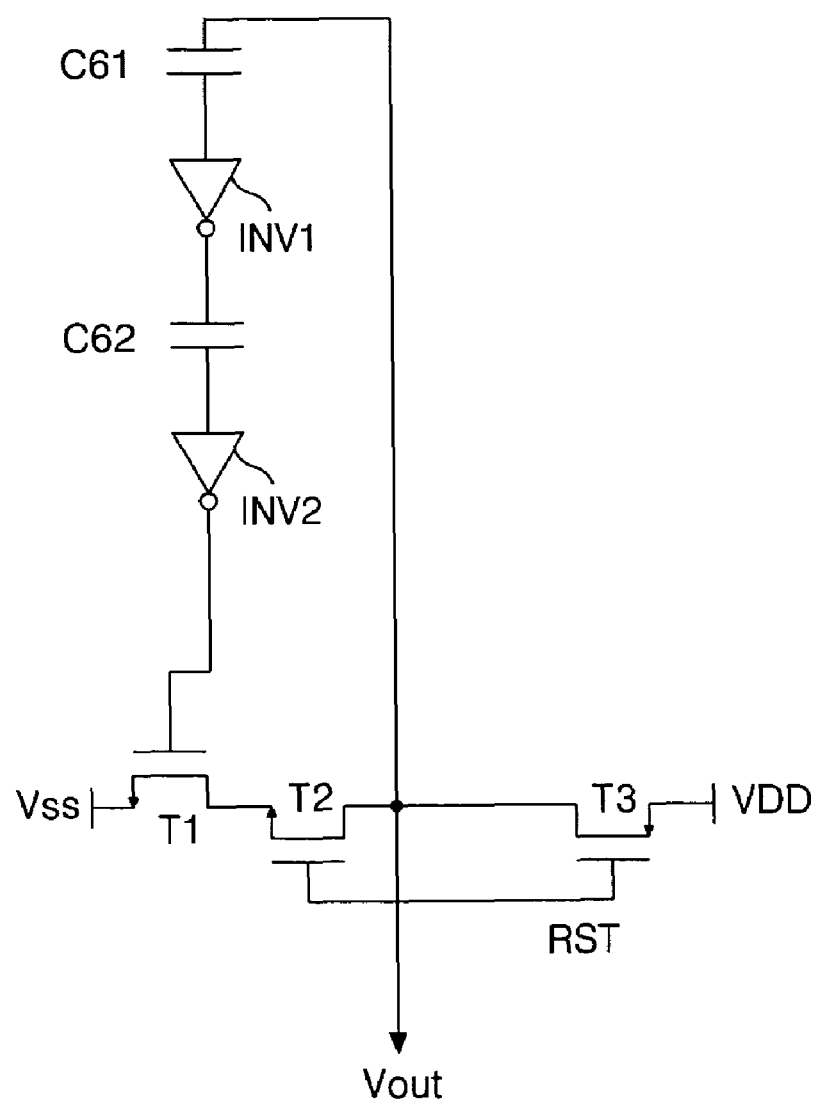
FIG. 9 is a circuit diagram illustrating a data output of a first sampling & holding circuit when the A control signal is at a logic high voltage and the B control signal is at a logic high voltage.

As shown in FIG. 8, the input node is connected to the third capacitor C63 and the input terminal and output terminal of the third inverter INV3 are connected to store the voltage difference between the input voltage Vin and the offset voltage of the third inverter INV3 at the third capacitor C63, and the output terminal of the third inverter INV1 and the fourth capacitor C64 are connected and the output terminal and input terminal of the fourth inverter INV4 are connected to store the voltage difference between the output voltage of the third inverter INV3 and the offset voltage of the fourth inverter INV4 to be stored at the fourth capacitor C64. Accordingly, the second sampling & holding circuit 62 samples the analog data voltage from the data driver and simultaneously compensates the analog data voltage for the offset voltage caused by the inverters INV3 and INV4. At the same time, the first sampling & holding circuit 61 is configured as in FIG. 9 to supply the output voltage Vout to the data line of the liquid crystal display panel.

As described above, the analog sampling apparatus of the liquid crystal display device according to the present invention uses one sampling & holding circuit to sample the input voltage while a second sampling & holding circuit supplies the input voltage to the data line of the liquid crystal display panel. Thus it is possible to secure sufficient sampling time and the data driving time.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An analog sampling apparatus of a liquid crystal display device, comprising:
   a data driver to generate an analog data voltage;
   a data output bus line to receive the analog data voltage;
   a first sampling and holding circuit connected to the data output bus line to compensate an offset voltage in the analog data voltage and to supply the analog data voltage to a data line of a liquid crystal display panel;
   a second sampling and holding circuit connected to the data output bus line arranged to sample the analog data voltage while the analog data voltage is supplied to the data line by the first sampling and holding circuit,
   a shift register to sequentially generate a sampling signal to sample the analog data voltage; and
   a timing controller to control the first and second sampling and holding circuits by generating a first control signal having a pulse width of one horizontal period and a period of two horizontal periods and a second control signal having an opposite phase to the first control signal, and to control the data driver and the shift register;
   a first AND gate to perform an AND operation of the sampling signal and the first control signal to input to the first sampling and holding circuit; and
   a second AND gate for performing an AND operation of the sampling signal and the second control signal to input to the second sampling and holding circuit,
   wherein the first sampling and holding circuit is arranged to supply the analog data voltage while the second sampling and holding circuit samples the analog data voltage, and to sample the analog data voltage while the second sampling and holding circuit supplies the analog data voltage.

2. The analog sampling apparatus according to claim 1, wherein the first sampling and holding circuit includes:
   a first switch device connected to the data output bus line to be controlled by an output signal of the first AND gate;
   a first capacitor connected to the first switch device;
   a first buffer connected to the first capacitor;
   a second switch device connected between an output terminal of the first buffer and a node between the first switch device and the first capacitor to be controlled by the first control signal; and
   a third switch device connected between the first buffer and the data line to be controlled by the first control signal.

3. The analog sampling apparatus according to claim 2, wherein the second sampling and holding circuit includes:
   a fourth switch device connected to the data output bus line to be controlled by an output signal from the second AND gate;
   a second capacitor connected to the fourth switch device;
   a second buffer connected to the second capacitor;
   a fifth switch device connected between an output terminal of the second buffer and a node between the fourth switch device and the second capacitor to be controlled by the second control signal; and
   a sixth switch device connected between the second buffer and the data line to be controlled by the second control signal.

4. The analog sampling apparatus according to claim 1, wherein the data driver converts a digital data from the timing controller into an analog data voltage to output the analog data voltage through the data output buses.

5. The analog sampling apparatus according to claim 2, wherein the first switch device of the first sampling and holding circuit is arranged to connect the data output bus with a first capacitor in response to an output from the first AND gate for a first horizontal period, and to interrupt a current path between the data output bus and the first capacitor for a second horizontal period.

6. The analog sampling apparatus according to claim 3, wherein the fourth switch device of the second sampling and holding circuit is arranged to connect the data output bus with a second capacitor in response to an output of the second AND gate for a second horizontal period, and to interrupt a current path between the data output bus and the second capacitor for a first horizontal period.

* * * * *